(12) United States Patent
Wu et al.

(10) Patent No.: US 6,249,189 B1
(45) Date of Patent: Jun. 19, 2001

(54) FREQUENCY SYNTHESIZER ACCOMPLISHED BY USING MULTIPHASE REFERENCE SIGNAL SOURCE

(75) Inventors: Jieh-Tsorng Wu, Taipei; Wer-Jen Chen, Ton-Liu, both of (TW)

(73) Assignee: National Science Council of Republic of China, Taipei (TW)

( * ) Notice: Subject to any disclaimer, the term of this patent is extended or adjusted under 35 U.S.C. 154(b) by 0 days.

(21) Appl. No.: 09/129,601

(22) Filed: Aug. 5, 1998

(51) Int. Cl.$^7$ .......................................................... A03L 7/06
(52) U.S. Cl. .................................. 331/18; 331/14; 331/45; 327/105; 327/107
(58) Field of Search ................................... 331/45, 16, 18, 331/23, 14, 74; 327/105, 107; 332/127

(56) References Cited

U.S. PATENT DOCUMENTS

| | | | |
|---|---|---|---|
| 4,965,531 | 10/1990 | Riley ........................................ | 331/14 |
| 5,889,436 | * 3/1999 | Yeung et al. ............................. | 331/2 |

OTHER PUBLICATIONS

Maneatis et al., IEEE Journal of Solid–State Circuits, 28:1273–1282 (1993).
Wu et al., 1997 IEEE Int'l Solid–State Circuits Conf, SCC97, Sess. 5, 80–81, Communication Building Blocks I, Paper TP 5.2.
Candy, IEEE Translations on Communication, COM–33:249–258 (1985).
Riley et al., IEEE Journal of Solid–State Circuits, 28:553–559 (1993).

* cited by examiner

*Primary Examiner*—Arnold Kinkead
(74) *Attorney, Agent, or Firm*—Bacon & Thomas, PLLC (57) ABSTRACT

A frequency synthesizer using a multiphase reference signal source consists of three portions: a basic phase locked loop including a variable frequency oscillator, a loop filter, a phase detector, and a frequency divider; a generating circuit including a multiphase reference signal source for providing a reference signal to the basic phase locked loop; and a frequency discriminator and phase modulator. The frequency discriminator facilitates detection of whether the main loop of the frequency synthesizer is approaching a phase locking state for a proper change of the loop bandwidth. The phase modulator is employed to change the output phase of the reference signal source in order to speed up phase locking and make it applicable to creating signals with a rapid frequency switching speed, frequency tuning capability, and fine channel resolution.

4 Claims, 11 Drawing Sheets

FREQUENCY SYNTHESIZER ACCOMPLISHED BY USING MULTIPHASE REFERENCE SIGNAL SOURCE

BACKGROUND OF THE INVENTION

1. Field of the Invention

The present invention relates to a circuit of a frequency synthesizer accomplished by using a multiphase reference signal source, and more particularly, to a frequency synthesizer capable of generating a signal capable of provinding fine channel resolution, low phase noise, and rapid channel switching speed in system circuits.

2. Description of the Prior Art

With the increase on popularity of radio communication systems, the relevant key circuits are in great demand. In a mobile telephone system, a rapid synchronization between transmitting and receiving terminals is essential to channel building. However, due to the limitation of communication spectrum bandwidth, a break-through shall depend on a high performance frequency synthesizer, which can provide fine channel resolution and high quality output with low phase noise.

Figure 1:
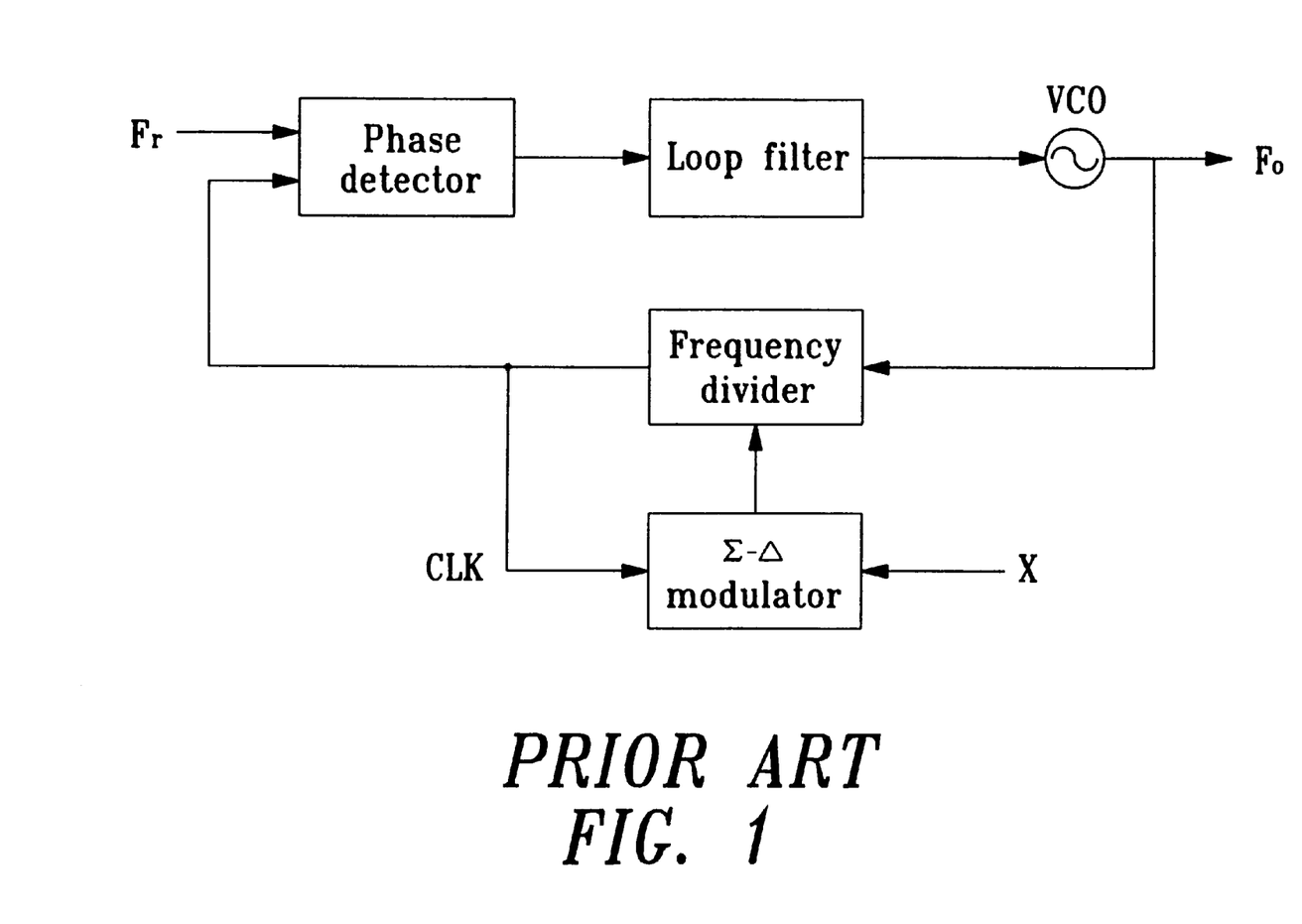
FIG. 1 A conventional fractional-N frequency synthesizer.

In order to achieve both the goals of fine channel resolution and rapid phase locking capability, the mechanism used for a conventional frequency synthesizer is a factional-N phase locked loop as shown in FIG. 1. Wherever a phase locking state is achieved, the output signal $F_0$ and reference signal $F_r$ should satisfy eq. $F_0 = N.f \times F_r$, in which, the coefficient N.f of the fractional-N frequency divider is controlled by a $\Sigma$-$\Delta$ modulator. The digital frequency control signal X of the modulator is converted into an analog voltage signal and applied to a loop filter so as to control the voltage controlled oscillator (VCO) to output a predetermined frequency, and meanwhile, the quantization noise introduced by the digital/analog conversion is shifted to a higher frequency band by the $\Sigma$-$\Delta$ modulator and removed by the low-pass loop filter.

For eliminating cross talk between the reference signal and quantization noise smoothed out by the $\Sigma$-$\Delta$ modulator, system designers have to narrow the loop bandwidth of the phase locked loop to a value lower tan one tenth of reference signal frequency $F_r$ as well as the signal bandwidth of the $\Sigma$-$\Delta$ modulator. Such a consideration may reduce phase noise of the output signal and meanwhile increase phase locking time Therefore, to achieve the design goals of fine channel resolution, reduction of system noise, and rapid phase locking capability simultaneously has become an important issue in design consideration for a high performance frequency synthesizer.

SUMMARY OF THE INVENTION

In view of the room for improvement of the conventional frequency synthesizer circuits, the inventor of the present invention has engaged in relevant R&D constantly, and finally has the opportunity to disclose this invention of a frequency synthesizer circuit.

The invented frequency synthesizer circuit comprises 3 portions: (1) A basic phase locked loop including a variable frequency oscillator, a loop filter, a phase detector, and a frequency divider; (2) A Multiphase signal generator granged to produce a reference signal for the basic phase locked loop; and (3) A Frequency discriminator and phase modulator circuit.

The frequency synthesizer circuit of the present invention may, at the same time, address problems regarding fine channel resolution, reducing phase noise, etc, and furthermore reduce phase locking and frequency hopping time.

BRIEF DESCRIPTION OF THE DRAWINGS

The drawings disclose an illustrative embodiment of the present invention, which serves to exemplify the various advantages and objects hereof, as follows:

FIG. 4 (A) Diagram of ring oscillators formed by combination of simple inverter in series.

FIG. 4 (B) Coupled array of dual-input inverters.

FIG. 4 (C) Coupled array of triple-input inverters.

DETAILED DESCRIPTION OF THE PREFERRED EMBODIMENT

Figure 2:
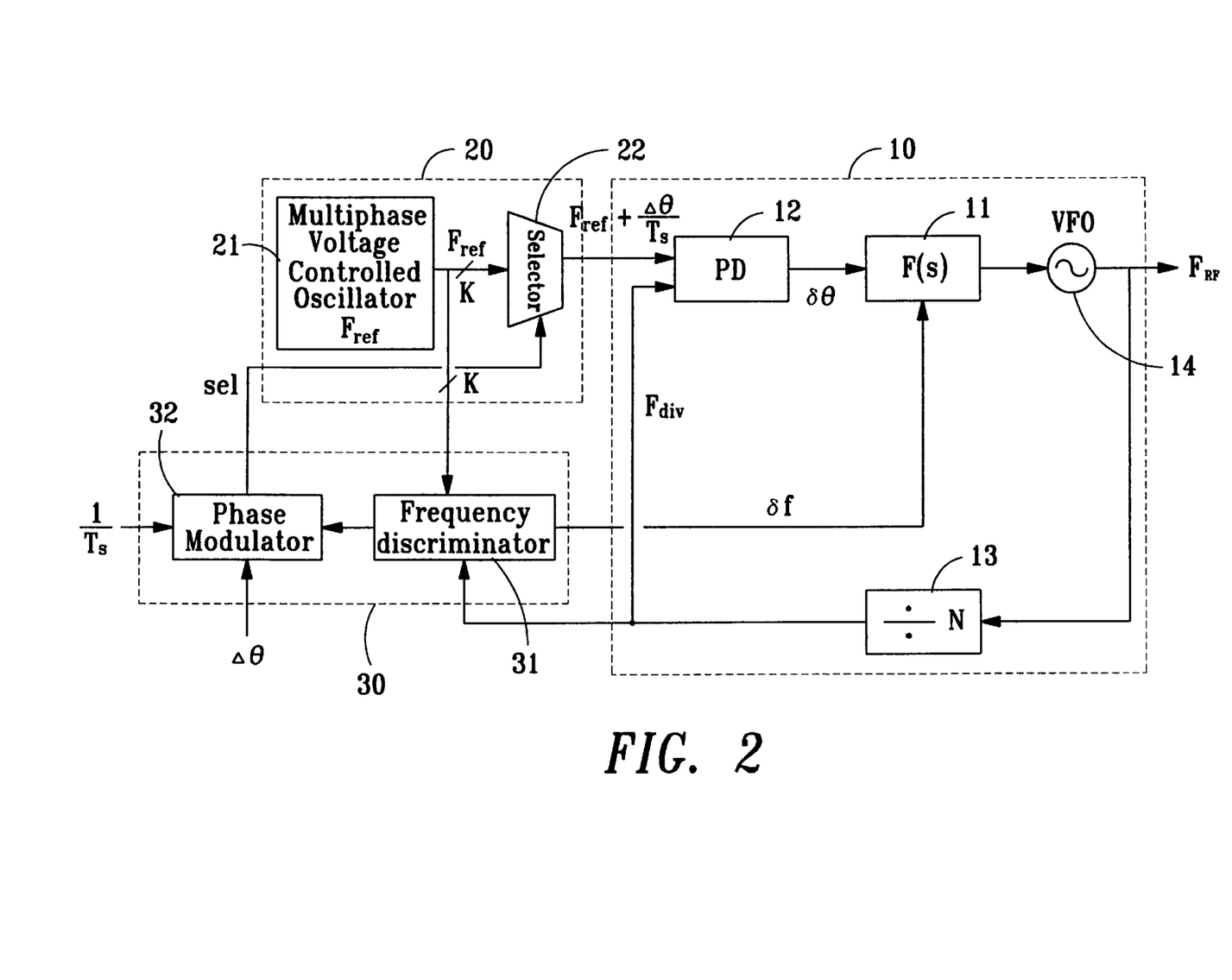
FIG. 2 Frequency synthesizer block diagram of the present invention.

Please refer to FIG. 2, which is a block diagram of a circuit mechanism of a the present invented frequency synthesizer. The circuit of the said frequency synthesizer comprises three portions: basic phase locked loop 10, multiphase reference signal source generating circuit 20, and frequency discriminating and phase modulating circuit 30, as described.

The basic phase locked loop 10 includes a variable frequency oscillator VFO 14, a loop filter F(s) 11, a phase detector (PD) 12, and a frequency divider 13, in which, the phase detector 12 is arranged to compare the phase difference between the reference signal $(F_{ref} + \Delta\theta/T_s)$ with an output signal $F_{div}$ or the frequency divider and base the output control signal $\delta\theta$ on the comparison sues to charge/discharge the loop filter.

The output signal of phase detector 12 ($\delta\theta$) and of frequency discriminator 31 ($\delta f$) are filtered through loop filter 11 to create a control voltage.

The output frequency $F_{RF}$ of a designated signal from oscillator VFO 14 is based on the applied control voltage in loop filter 11.

Frequency divider 13 is arranged to convert the output signal ($F_{RF}$) of the variable frequency oscillator VFO 14 via a dividing process into a lower frequency signal $F_{div}$ which is taken as one input signal to phase detector 12, where $F_{RF}$ is N times of $F_{div}$.

Figure 3:
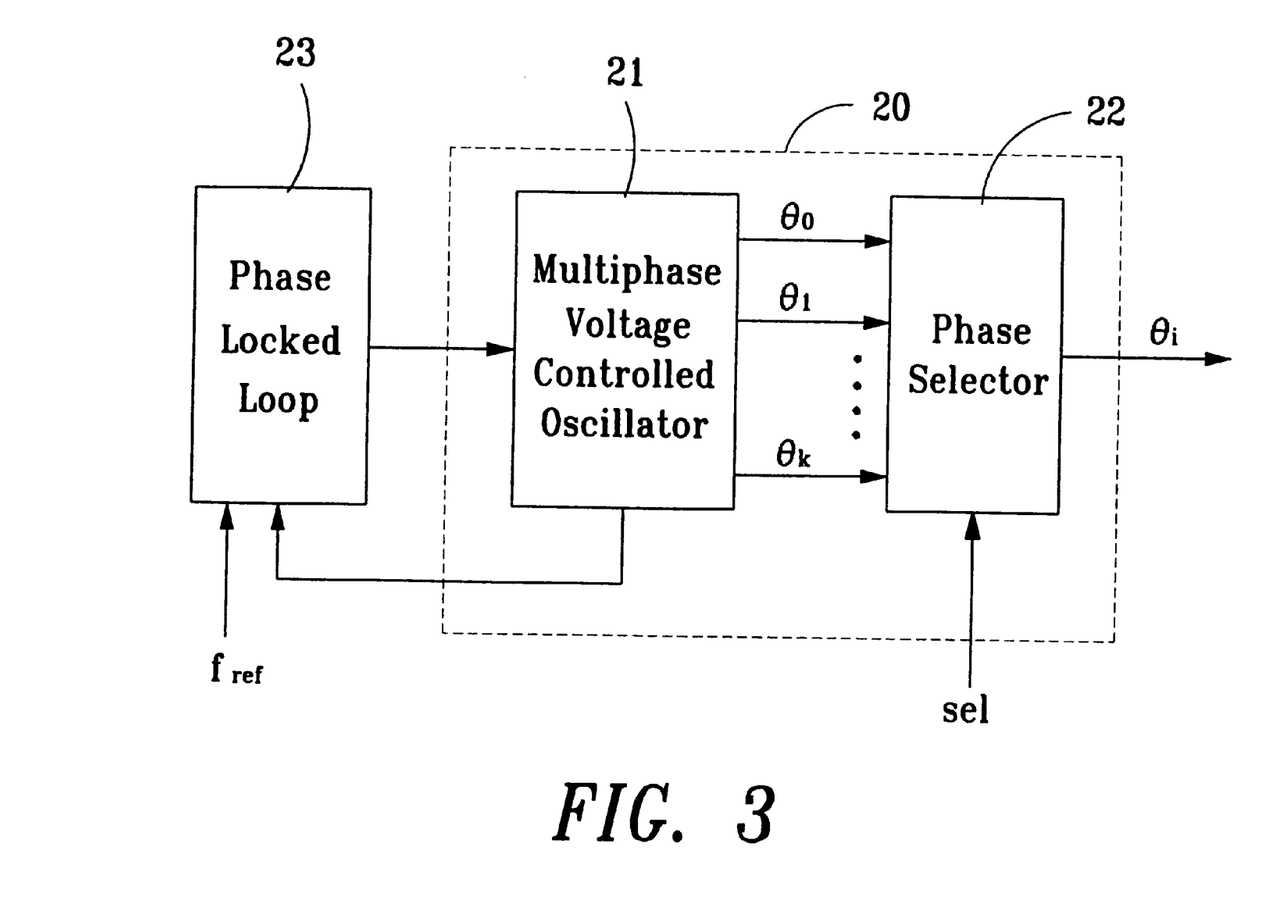
FIG. 3 Circuit block diagram of a multiphase reference signal source.

FIG. 3 is a block diagram of a multiphase reference signal source circuit 20, which is used to generate a reference signal for the present invented frequency synthesizer. As shown in FIG. 3, circuit 20 consists of a multiphase voltage controlled oscillator 21 and a phase selector 22. The multiphase voltage controlled oscillator 21 may combine an extra phase detector, frequency divider, and loop filter to form a phase locked loop to stabilize the frequency of the
} output signal, and the multiphase voltage controlled oscillator 21 is employed to divide a period equally into K units of reference signal source of different phases. Phase selector 22 is used to select a single-phase output signal $\theta_i$ as a reference signal for this frequency synthesizer according to output control signal (Sel) of phase modulator.

Figure 4A:
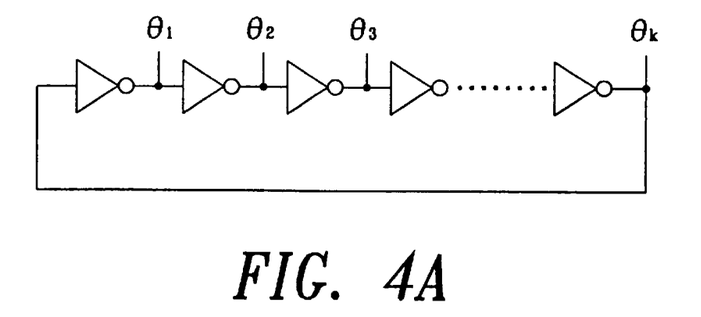
Figure 4B:
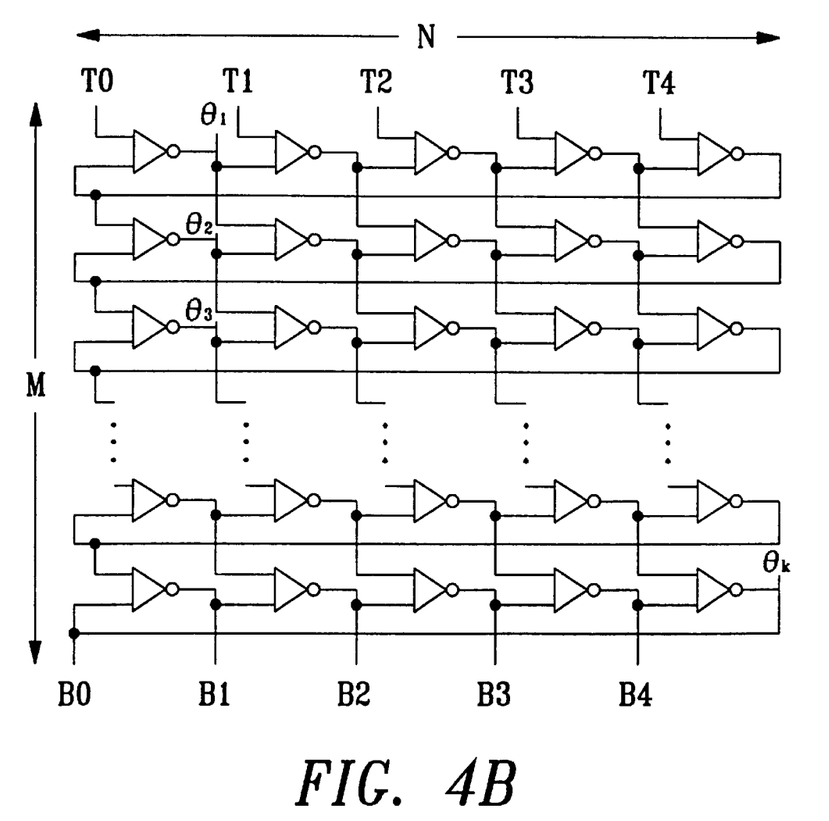
Figure 4C:
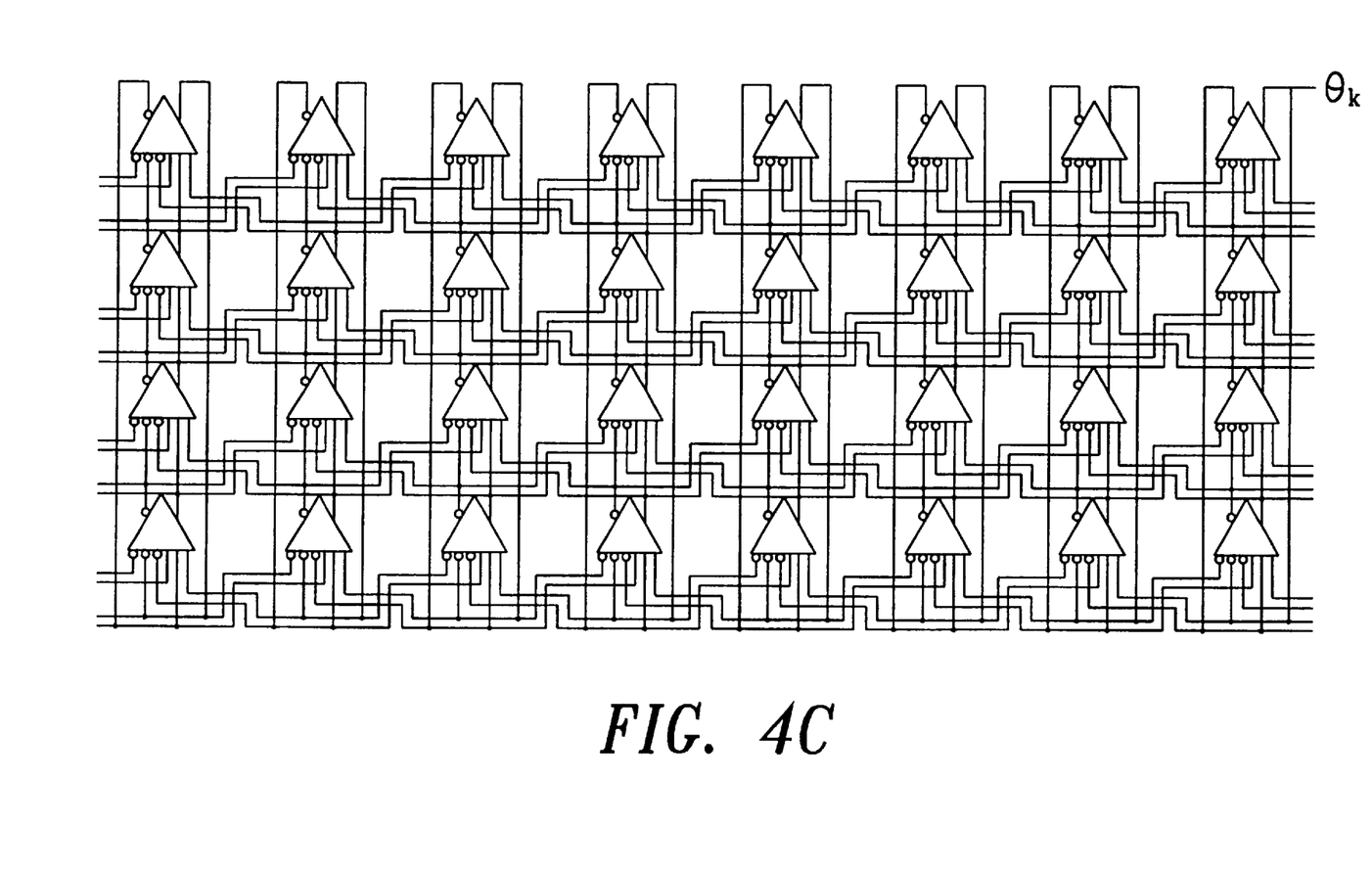

The multiphase reference signal source may be one of (1) A ring circuit constructed by simple inverters connected in series as shown in FIG. 4 (A); (2) A coupled array of dual-input inverters [1], as shown in FIG. 4 (B); or (3) A coupled array of triple-input inverters [2], as shown in FIG. 4(C).

Figure 5:
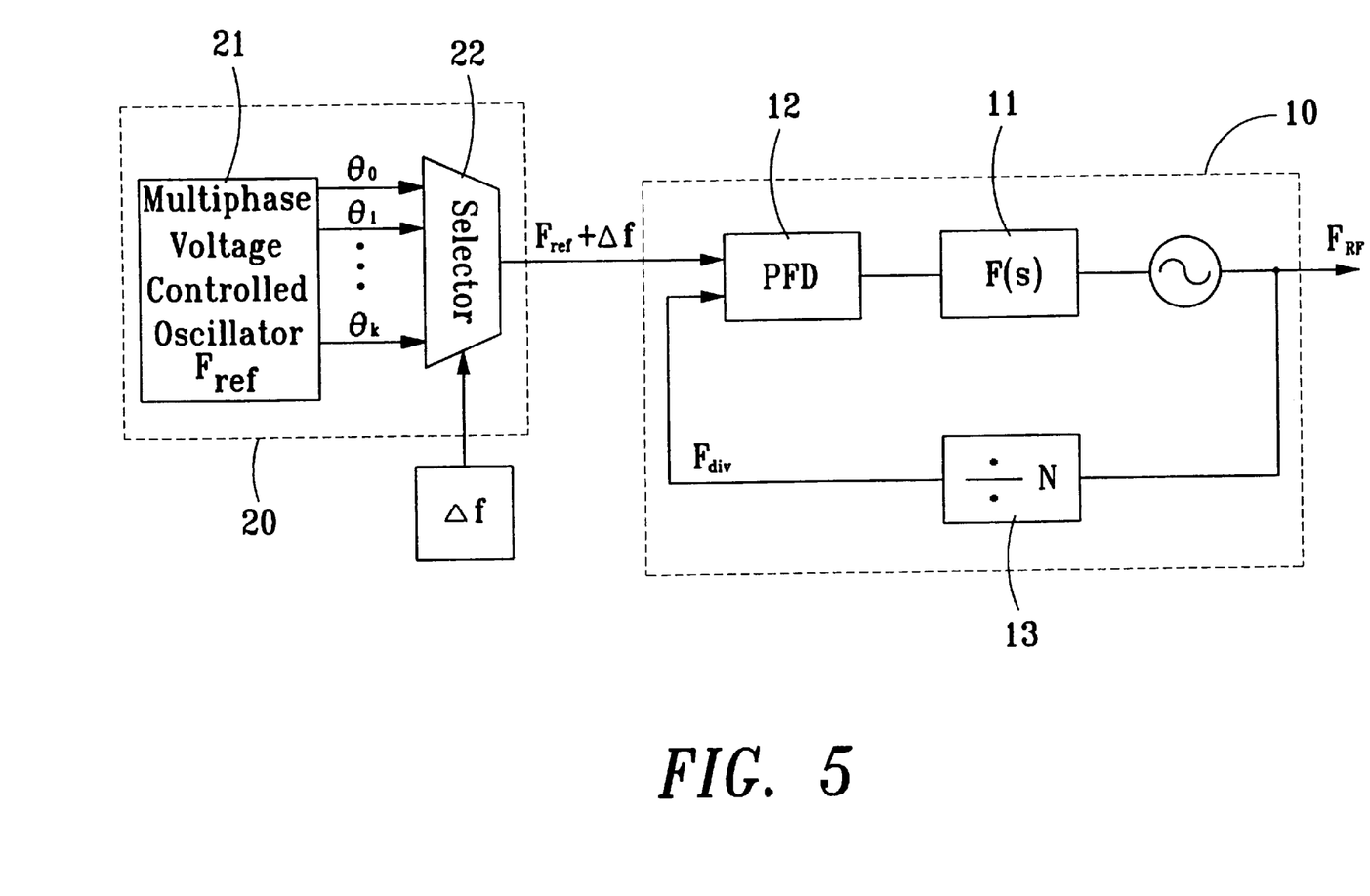
FIG. 5 Frequency synthesizer accomplished by using multiphase reference signal source.

As Shown in FIG.1, the phase locked loop includes a fractional-N frequency divider wherein the output signal $F_0$ and reference signal $F_r$ satisfy eq. $F_0 = N.f \times F_r$. Therefore, by changing either the divide ratio N.f or $F_r$, we can duly vary the output frequency $F_0$. In our design, we create an equivalent variable frequency reference signal $F_{ref} + \Delta f$ for the phase locked loop by modulating the reference signal output phase, and therefore, we can adjust the frequency of the output signal. FIG. 5 is a conceptual circuit schematic which explains the relevant methods as follows:

Since only one of the multiphase reference signal source ($F_{ref}$) will be chosen as an input signal to the phase detector in phase locked loop 10, we select the output signal with increasing or decreasing phase offsets (n$\Delta\theta$n=0 . . . k), and thereby we may synthesize an equivalent variable frequency signal in accordance with the magnitude of the offset ($\Delta\theta$) and selection period ($T_S$) of selector 22. Since an output signal can only have a discrete phase offset during selected time periods, the output signal will include a quantization noise q (t), and, the equivalent frequency of the output signal may be expressed as $F_{ref} + \Delta\theta/T_s + q$ (t). thus, Although a signal produced by the said method has the frequency tuning capability, a problem of quantization noise arises to solve such a problem, the $\Sigma$-$\Delta$ modulator is used to modulate the signal $\Delta\theta$ for phase selection to get rid of phase noise incurred in the signal spectrum.

Figure 6:
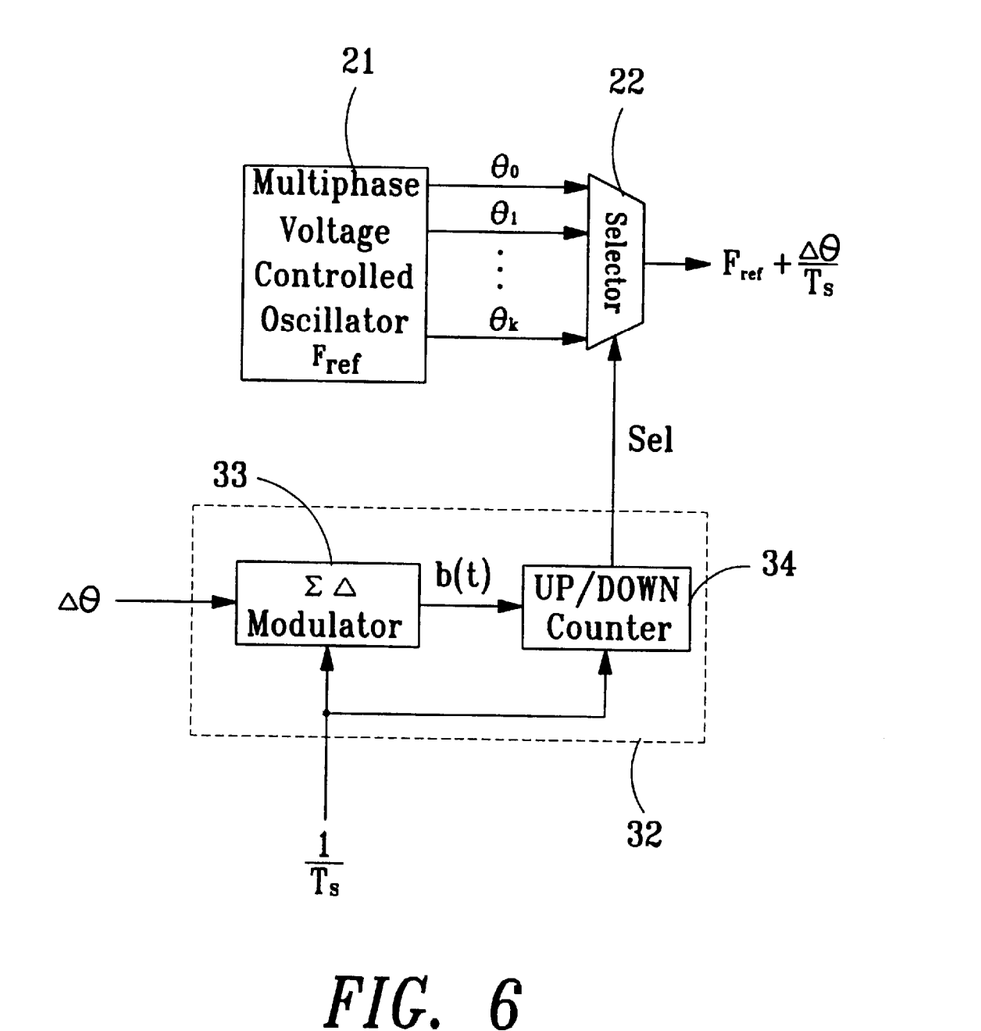
FIG. 6 A phase modulator circuits.

Please refer to FIG. 6, a phase modulator 32 mainly includes a $\Sigma$-$\Delta$ modulator 33 and an associated up/down counter to produce a control signal (Sel) for phase selection.

From the above description, we understand, that the frequency modulating quantity $\Delta f$ of equivalent output frequency $F_{ref} + \Delta f$ is related to phase offset $\Delta\theta$ and selection period $T_s$. Hence, as soon as the phase offset $\Delta\theta$ and the selection period are determined, the frequency offset quantity can thus be decided. Meanwhile, in order to avoid quantization noise in the output signal caused by discrete phase offset, we take a $\Sigma$-$\Delta$ modulator 33 to modulate the phase selection quantity.

The $\Sigma$-$\Delta$ modulator 33 is usually employed in high resolution A/D or D/A converters. The associated over sampling techniques and low-pass filter are so arranged for the purpose of reducing the quantization noise in the signal spectrum brought about by the converter. Such a concept is also applicable to the implementation of a frequency synthesizer [3].

In case we let the control signal of frequency modulation $\Delta\theta$ go firstly through a $\Sigma$-$\Delta$ modulator 33, the output bit streams b (t) are counted via an Up/Down counter 34 for accumulative computation of phase offsets ($\Delta\theta$). accumulated phase offsets correspond to assigned phase in the multiphase signal generator. By doing so, the quantization noise q (t) of the synthesized signal $F_{ref} + \Delta \theta/T_s + q(t)$ can be shaped out to a higher frequency band.

It has been proven [4] that a high order $\Sigma$-$\Delta$ modulator possesses a better ability to shift frequencies for quantization noise. The quantization noise arises at 20dB per decade with the second-ordth $\Sigma$-$\Delta$ modulator, and 40 dB per decade with the third-order $\Sigma$-$\Delta$ modulator. A $\Sigma$-$\Delta$ modulator will not attenuate the control DC signal.

Figure 7:
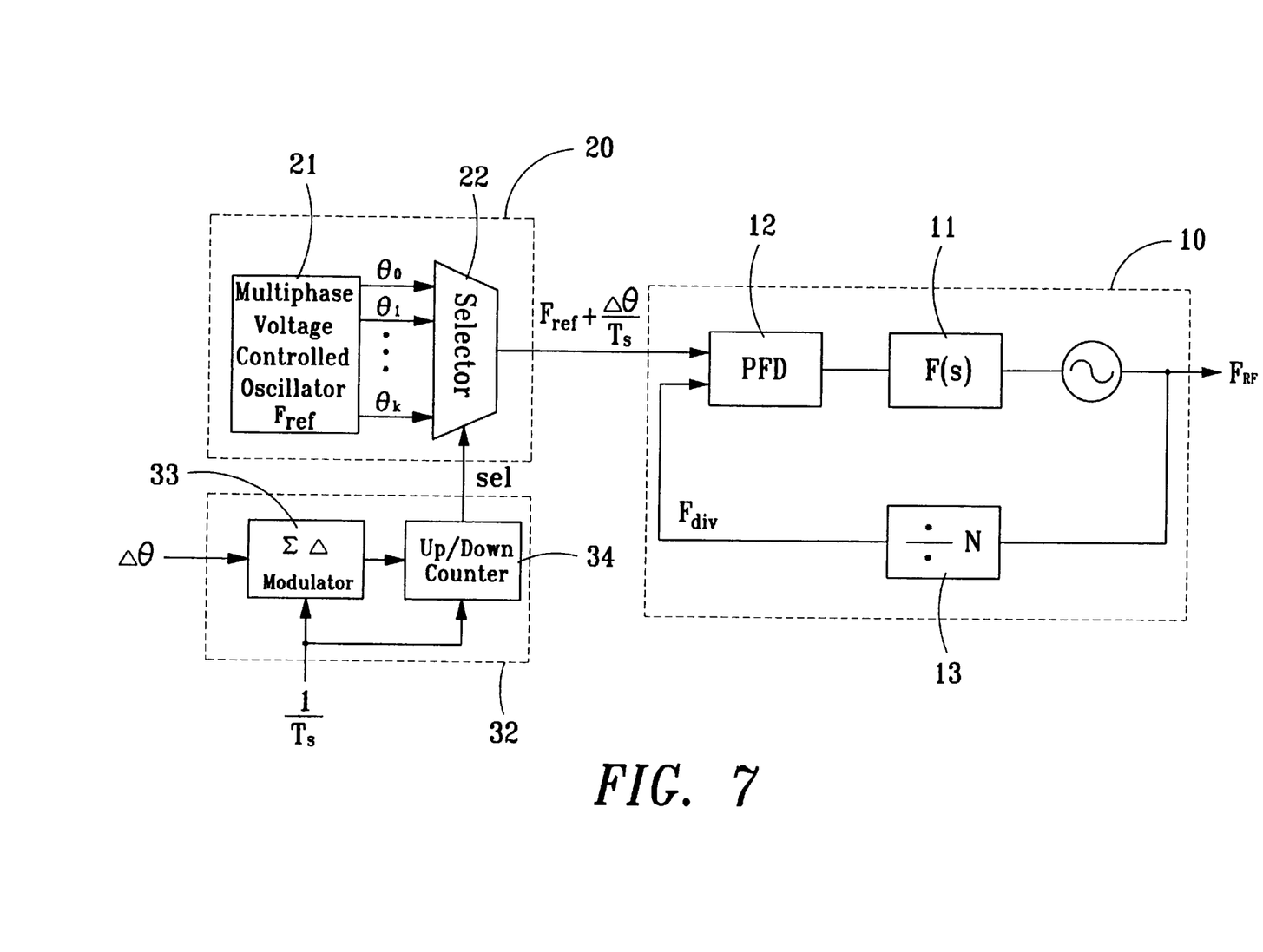
FIG. 7 A frequency synthesizer using multiphase reference signals.

Thus, the combination of a phase modulator and a multiphase signal generator may synthesize an equivalent variable frequency signal source, and the phase noise thereof may be shifted to a higher frequency band. Such a construction works together with an associated phase locked loop to become a frequency synthesizer which can, by availing itself of low-pass filtering character to the reference signal of the phase locked loop, remove quantization noise in the high frequency band. The mechanism is shown in FIG. 7.

Figure 8:
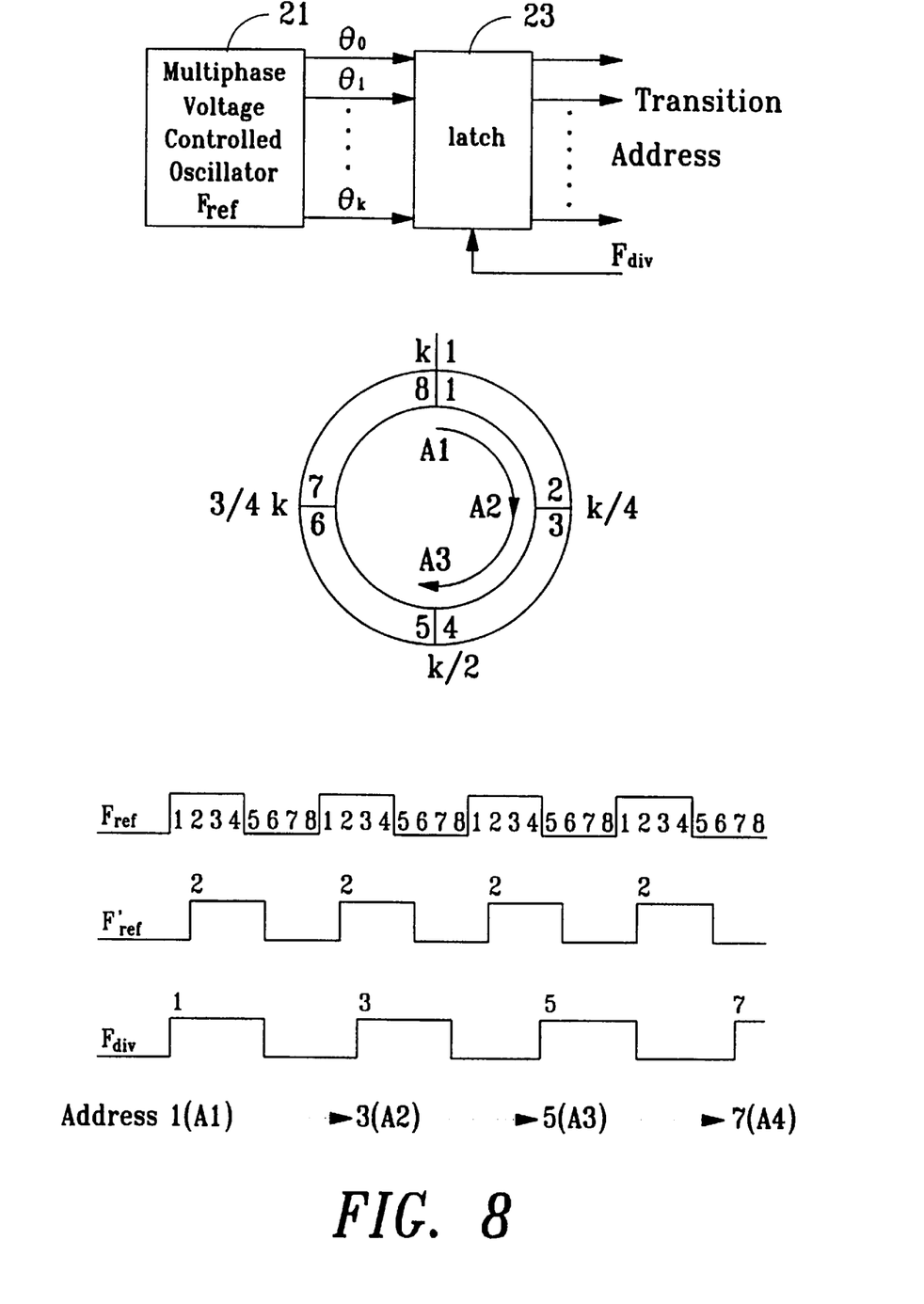
FIG. 8 Conceptual diagram of frequency discriminator accomplished by using multiphase reference signal source.

We are now to describe the operation principle of a frequency discriminator. As mentioned above, by modulating the output phase of a multi-phase reference signal source, an equivalent variable frequency signal source is generated. Similarly, applying a multiphase reference signal source to accomplish a frequency discriminating circuit is possible. FIG.8 shows the manner in which the frequency discriminating circuit applies multiphase reference signal source, wherein a multiphase voltage controlled oscillator 21 is employed to generate reference signals with uniformly distributed k phases with a center frequency Fref as the base for detecting signal frequency.

During frequency detection, by means of latch 23, a signal whose frecuency is used to be discriminated, such as the frequency divider output signal detection Fdiv is to sample the multiphase reference signal source periodically to find the corresponding phase of the multiphase reference signal source, which transits synchronously with the transition edge of the signal whose frequency is to be detected The address of the corresponding phase in the multiphase reference signal source in defined as the transition address. When the signal whose frequency is to be detected and the reference signal have the same frequency, the transition address fetched by signal pending detection should be the same, as shown in FIG. 8, i.e. the fetched transition address is the same in the case of $F_{ref}$ vs $F_{ref}$. However, when the signal whose frequency is to be discriminated and the reference signal have different frequencies, the fetched transition address indicates a periodical serial figure, just as in the case of signal $F_{div}$ vs $F_{ref}$. Consequently, according to the change of fetched transition address, we may thereby detect the frequency relationship between them.

Figure 9:
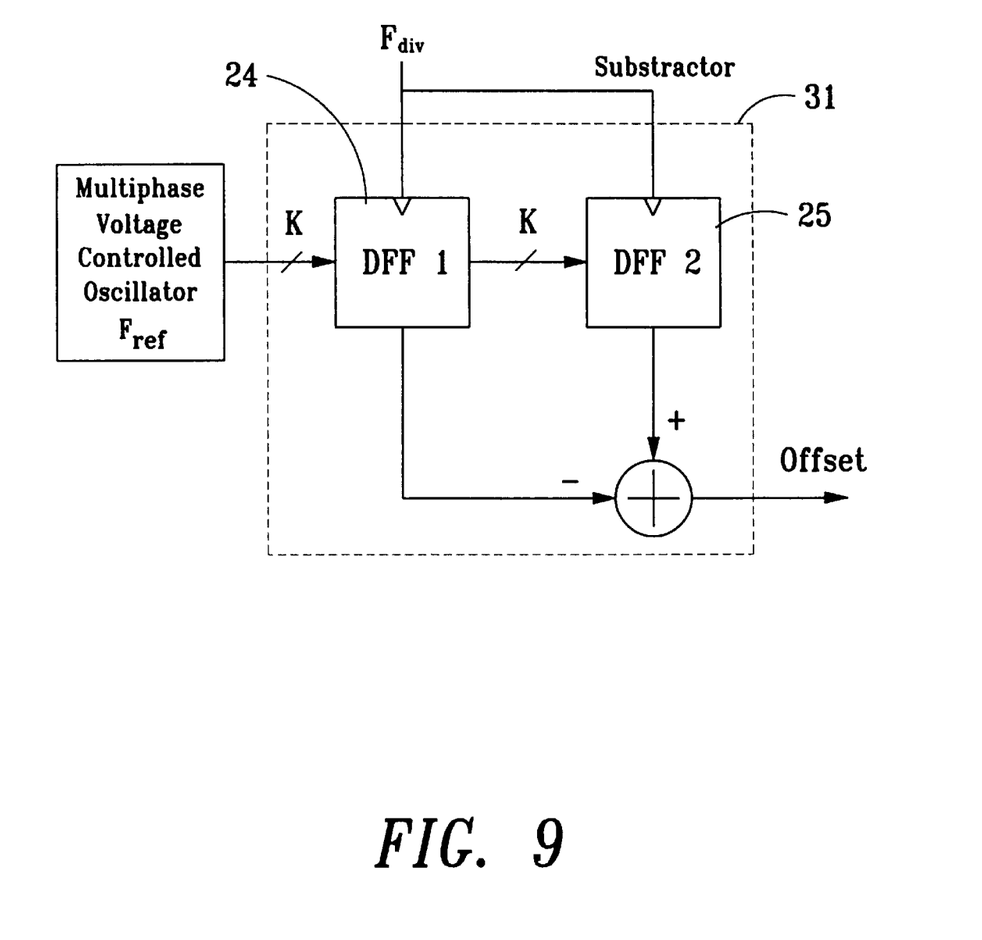
FIG. 9 Block diagram of frequency discriminator.
Figure 10:
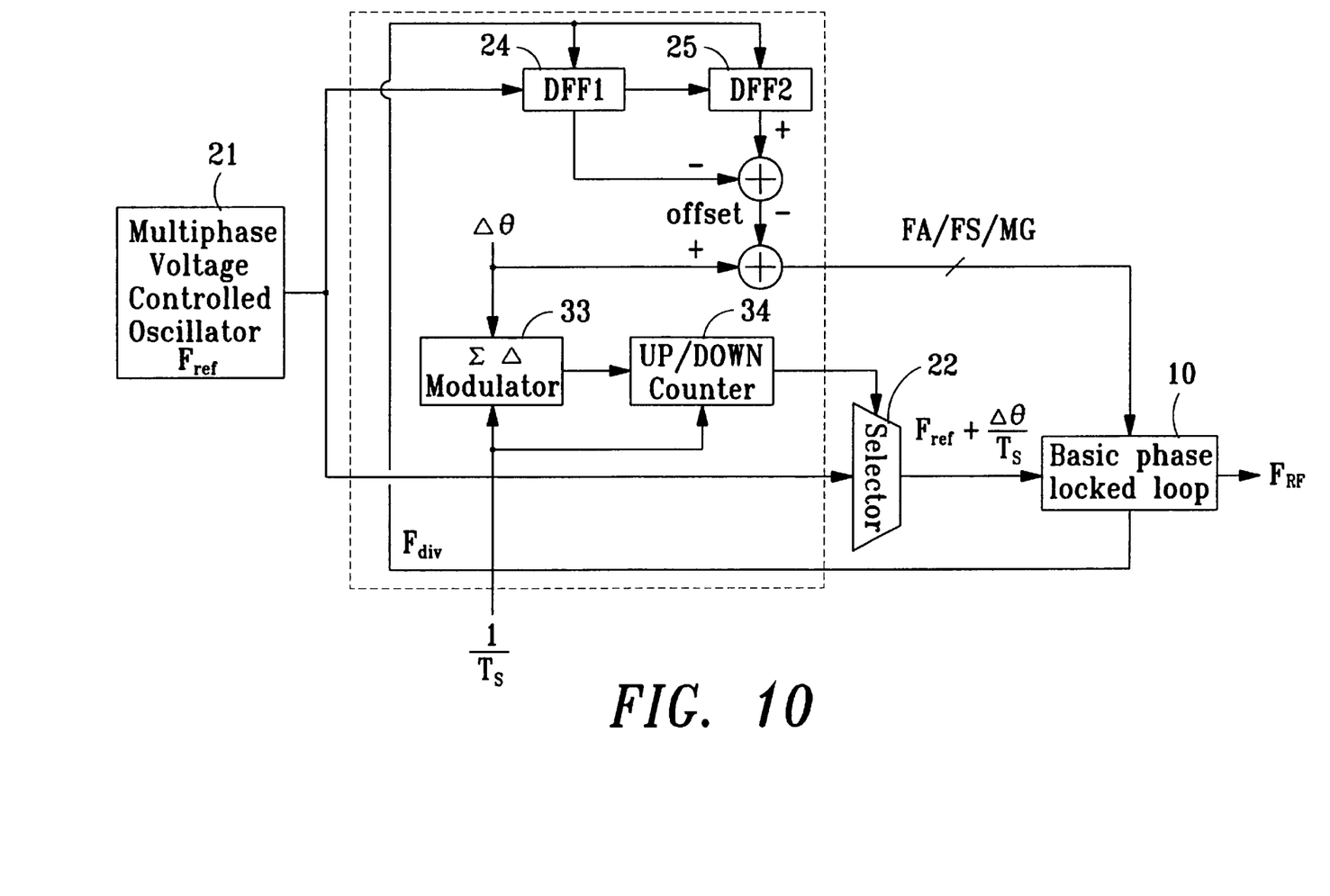
FIG. 10 Block diagram of frequency discriminator and phase modulator.

For fetching the offset, we use the structure shown in FIG. 9, wherein a signal pending detection $F_{div}$ is to sample the multiphase reference signal source periodically, and deposits the sampled address in registers. The address deposited in register #1 (DFF1) 24 and register #2(DFF2) 25 is the transition address fetched in the present and preceding period respectively. When the obtained transition address go is subject to a subtraction operation then we have the offset of the address in a period. According to the difference between the obtained offset in the frequency discriminator and the preset offset ($\Delta\theta$) in the phase modulator, we can evaluate the frequency difference between the frequency divided signal $F_{div}$ and reference signal $F_{ref} + \Delta\theta/T_s$, as indicated by the dotted portion shown in FIG. 10 the output (a) signal of frequency acquisition (FA) is used to determine if it is necessary to widen the loop bandwidth of phase-locked loop so as to accelerate speed of phase locking for a relatively large frequency difference; the (b) signal of fast/slow(FS) is used to tell the speed of the two frequencies and as an auxiliary signal for charge the pump circuit of the basic phase locked loop 10 to speed up phase locking; the (c) signal of magnitude(MG) is used to tell the magnitude of difference between two frequencies and as an auxiliary signal for the charge pump circuit of the basic phase locked loop to speed up phase locking. The output value of the loop filter is thereby changed to achieve rapid frequency locking capability.

Many changes and modifications in the above-described embodiment of the invention can, of course, be carried out without departing from the scope whereof. Accordingly, to promote the progress in science and the useful arts, the invention is disclosed and is intended to be limited only by the scope of the appended claims.

[References]

[1] J. G. Maneatis and M. A. Horowitz. "Precise delay generation using coupled oscillators". IEEE Journal of Solid-State Circuits, pp.1273–1282, Dec. 1993.

[2] Jieh-Tsomg Wu, Horng-Der Chang, and Pi-Fen Chen, "A 2V 110 MHz CMOS vector modulator", in 1997 IEEE ISSCC Dig. Tech Papers, pp80–81, Feb. 1997.

[3] Thomas A. D. Riley, "Frequency synthesizers having dividing ratio controlled by sigma-delta modulator", U.S. Pat. No. 4,965,531.

[4] J. C. Candy, "Use of double integration in sigma-delta modulation", IEEE Transactions on Communications, vol. COM-33, pp. 249–258, Mar. 1985.

[5] Thomas A. D. Riley, Miles A. Copeland, and Tad A. Kwasniewski,"Delta-sigma modulation in fractional-N frequency synthesis", in IEEE Journal of Solid-State Circuits, pp. 553–559, vol. 28, No. 5, May 1993.

What is claimed is:

1. A frequency synthesizer accomplished by using a multiphase reference signal source, comprising:

a basic phase locked loop including a variable frequency oscillator, a loop filter, a phase detector, and a frequency divider;

a multiphase reference signal source producing equally distributed multiphase output signals of designated frequency coupled to a selector for selecting a single phase output in the multiphase reference signal source as a reference signal for the basic phase locked loop, and by using a frequency discriminator to judge if a main loop of the frequency synthesizer approaches a phase locking state in order to properly adjust phase locked loop bandwidth and an output phase of the reference signal source for speeding up phase locking and thereby making it a signal applicable for producing rapid frequency switching speed and a fine channel resolution output signal.

2. A frequency synthesizer accomplished by using a multiphase reference signal source, comprising:

a basic phase locked loop including a variable frequency oscillator, a loop filter, a phase detector, and a frequency divider;

a multiphase reference signal source producing equally distributed multiphase output signals of designated frequency coupled to a selector; and a phase modulator consisting of a $\Sigma$-$\Delta$ modulator and an up/down counter which accumulates a frequency modulating control signal $\Delta\theta$ and selects via a selector a signal phase output of the multiphase reference signal source to be a reference signal for the basic phase locked loop, and by such a manner, the modulator is capable of equivalently modulating the frequency of the reference signal from $F_{ref}$ to $F_{ref}+\Delta\theta/T_s$ to achieve the purpose of changing frequency of the output signals.

3. A frequency discriminator for discriminating a frequency of a signal whose frequency is to be detected, accomplished by using a multiphase reference signal source, comprising:

a generating circuit of the multiphase reference signal source; and a latch circuit having an input terminal coupled to sample a reference signal output by the generating circuit of the multiphase reference signal source, said latch circuit being periodically triggered by said signal whose frequency is to be discriminated, wherein the latch circuit outputs a transition address corresponding to a phase of a sampled reference signal relative to a most adjacent rising edge of the signal whose frequency is to be discriminated, and wherein the frequency difference between the signal whose frequency is to be discriminated and the reference signal corresponds to a variation of the transition address latched by the signal whose frequency is to be discriminated.

4. A multiphase frequency synthesizer accomplished by using a multiphase reference signal source, comprising:

a basic phase locked loop including a variable frequency oscillator, a loop filter, a phase detector, and a frequency divider;

a generating circuit of the multiphase reference signal source producing multiphase signals and a phase selector to select one of the multiphase signals as the reference signal to the phase locked loop; and a frequency discriminator and phase modulator, wherein the phase modulator further comprises a $\Sigma$-$\Delta$ modulator and an up/down counter employed for equivalently setting a frequency of the reference signal by changing an output phase of the reference signal; and the frequency discriminator is arranged to detect the frequency difference between the reference signal and a divided signal output by the frequency divider in the phase locked loop by using the divided signal to sample periodically the multiphase reference signal in order to fine a corresponding transition address and to compute its offset in a sampling period, said transition address being compared with an external preset phase offset for judgement of the frequency difference between the divided signal and the reference signal, thereby creating signals having a discriminated frequency difference to vary frequency of the output signal or to generate a signal for changing a phase locked loop bandwidth for accelerating phase locking speed.

* * * * *